(12) United States Patent
Lu et al.

(10) Patent No.: US 8,908,347 B2
(45) Date of Patent: Dec. 9, 2014

(54) APPARATUS, SYSTEM, AND METHOD FOR ELECTROSTATIC DISCHARGE PROTECTION

(75) Inventors: Lin Lu, San Diego, CA (US); Andrew Stephen Poynot, San Diego, CA (US)

(73) Assignee: KYOCERA Corporation, Kyoto (JP)

( * ) Notice: Subject to any disclaimer, the term of this patent is extended or adjusted under 35 U.S.C. 154(b) by 878 days.

(21) Appl. No.: 12/493,945

(22) Filed: Jun. 29, 2009

(65) Prior Publication Data

US 2009/0262481 A1 Oct. 22, 2009

Related U.S. Application Data

(63) Continuation of application No. 11/150,559, filed on Jun. 10, 2005, now Pat. No. 7,567,419.

(51) Int. Cl.
*H02H 3/22* (2006.01)
*H05K 1/02* (2006.01)
*H05K 9/00* (2006.01)
*H04M 1/23* (2006.01)

(52) U.S. Cl.
CPC ............ *H05K 9/0067* (2013.01); *H05K 1/0256* (2013.01); *H05K 1/0259* (2013.01); *H01H 2239/008* (2013.01); *H04M 1/23* (2013.01)
USPC ........................................................ 361/212

(58) Field of Classification Search
USPC .................. 361/112, 120, 212, 220
See application file for complete search history.

(56) References Cited

U.S. PATENT DOCUMENTS

| | | | |
|---|---|---|---|
| 3,354,373 A | 11/1967 | Fatovic | |
| 4,456,800 A * | 6/1984 | Holland | 200/5 A |
| 4,778,952 A * | 10/1988 | Watkins et al. | 200/5 A |
| 5,335,137 A | 8/1994 | English et al. | |
| 5,513,078 A | 4/1996 | Komrska et al. | |
| 5,557,079 A | 9/1996 | Jackson et al. | |
| 5,565,658 A | 10/1996 | Gerpheide et al. | |
| 5,661,279 A | 8/1997 | Kenmochi | |
| 5,796,570 A * | 8/1998 | Mekdhanasarn et al. | 361/126 |
| 6,002,388 A | 12/1999 | Seffernick et al. | |

(Continued)

FOREIGN PATENT DOCUMENTS

| | | |
|---|---|---|
| EP | 0788161 | 8/1997 |
| JP | 11-195343 | 7/1999 |
| JP | 2002-260480 | 9/2002 |

OTHER PUBLICATIONS

International Search Report (ISR): PCT/ISA/210 for International Application No. PCT/US2006/021383, ISR dated Oct. 9, 2006.

*Primary Examiner* — Ronald W Leja

(57) ABSTRACT

An apparatus, system, and method provide electrostatic discharge (ESD) protection in electronic devices. The ESD channels are positioned within the electrical insulation sheet to provide electrical paths to ground having a lower impedance than electrical paths to protected areas covered by the electrical insulation sheet. An ESD follows the path of least resistance safely to ground rather than to a critical component within the electronic device. The ESD channels are openings in a dome contact layer of a keypad where the openings are positioned over one or more ground areas of a printed circuit board (PCB) and the insulating material of the dome contact layer covers areas of the PCB that are protected from ESD. By implementing dedicated GPIO lines, grounded metal domes cover the signal pads in the target discharge area to protected the GPIO lines from ESD. Device components are protected from ESD without additional ports or insulation.

21 Claims, 4 Drawing Sheets

(56) References Cited

U.S. PATENT DOCUMENTS

| | | | |
|---|---|---|---|
| 6,140,596 A | 10/2000 | Tsay | |
| 6,207,912 B1 | 3/2001 | Persson | |
| 6,288,687 B1 * | 9/2001 | Glatz | 343/906 |
| 6,339,200 B1 | 1/2002 | Shi et al. | |
| 6,493,198 B1 | 12/2002 | Arledge et al. | |
| 6,791,037 B1 * | 9/2004 | Ling | 200/4 |
| 6,836,397 B2 * | 12/2004 | Chen et al. | 361/220 |
| 6,987,233 B2 * | 1/2006 | Cole et al. | 200/341 |
| 6,999,294 B2 * | 2/2006 | Festag et al. | 361/112 |
| 2003/0215116 A1 | 11/2003 | Brandt et al. | |
| 2004/0013262 A1 | 1/2004 | Henry | |
| 2004/0252867 A1 * | 12/2004 | Lan et al. | 382/124 |
| 2004/0257727 A1 | 12/2004 | Chu | |
| 2005/0052353 A1 * | 3/2005 | Shiizaki et al. | 345/60 |
| 2005/0111085 A1 * | 5/2005 | Kato | 359/366 |

\* cited by examiner

APPARATUS, SYSTEM, AND METHOD FOR ELECTROSTATIC DISCHARGE PROTECTION

RELATED APPLICATIONS

This application is a continuation application of U.S. patent application Ser. No. 11/150,559, filed Jun. 10, 2005 now U.S. Pat. No. 7,567,419, entitled "APPARATUS, SYSTEM, AND METHOD FOR ELECTROSTATIC DISCHARGE PROTECTION, assigned to the assignee hereof and hereby expressly incorporated by reference herein.

BACKGROUND OF THE INVENTION

The invention relates in general to electronic devices and more specifically to an apparatus, system, and method for electrostatic discharge (ESD) protection in an electronic device.

Electronic devices such as, for example, cellular telephones, personal digital assistants (PDA), portable media players, and portable computers are susceptible to damage by electrostatic discharge (ESD). ESD is the rapid and spontaneous transfer of electrical charge between two objects. One example of ESD that can be experienced particularly in dry climates includes the "shock" or spark resulting from the discharge of electrostatic charge when a hand or figure is placed near a doorknob after the electrostatic charge has formed due to shuffling across carpet. ESD occurs in a variety of situations, however, and does not need to be felt to cause extensive damage to sensitive components in electronic devices. Keypads, buttons, and other user interfaces on electronic devices provide an especially vulnerable entry point for electrostatic charges to reach electronic device components.

Some conventional designs reduce the susceptibility of electronic devices to ESD by increasing the thickness of insulating materials at the vulnerable areas. For example, the thickness of the shaped rubber layer forming the keypad of a device can be increased to insulate the sensitive components from ESD. This technique is limited in that, due to the increased thickness, the size of the overall size of the electronic device is increased. Further, the electronic device may be more difficult and costly to manufacture since the thicker keypad requires more material and is more difficult to manipulate. Also, the thicker material may result in a keypad that is bulkier, less sensitive, and more difficult to use.

Other conventional techniques for reducing susceptibility to ESD include the placement of circuit elements such as diodes to "short out" ESD and direct charges to ground. These methods, however, are limited in that the complexity and cost of the electronic device is increased.

Other conventional designs include a conductive escutcheon that surrounds at least some of the buttons of a keypad and is connected to the ground of the electronic device. This technique is limited in that the escutcheon is difficult and costly to manufacture. Further, the escutcheon often can not be shaped to adequately protect the areas that are vulnerable to ESD penetration. For example, as the sizes of the keys of keypads decrease, the available space for positioning the sections of the conductive escutcheon also decreases resulting in device areas that are not adequately protected against ESD.

Accordingly, there is a need for an apparatus, system, and method for electrostatic discharge (ESD) protection in an electronic device.

DETAILED DESCRIPTION OF THE PREFERRED EMBODIMENTS

An apparatus, system, and method provide electrostatic discharge (ESD) protection in electronic devices by guiding electrostatic charges to a ground through ESD channels within electrical insulation sheet. The ESD channels are positioned within the electrical insulation sheet to provide electrical paths to ground having a lower impedance than electrical paths to protected areas covered by the electrical insulation sheet. Accordingly, an ESD follows the path of least resistance safely to ground rather than to a critical component within the electronic device. In the exemplary embodiment, the ESD channels are openings in a dome contact layer of a keypad where the openings are positioned over one or more ground sections of a printed circuit board (PCB) and the insulting material of the dome contact layer covers areas of the PCB that are protected from ESD.

Figure 1:
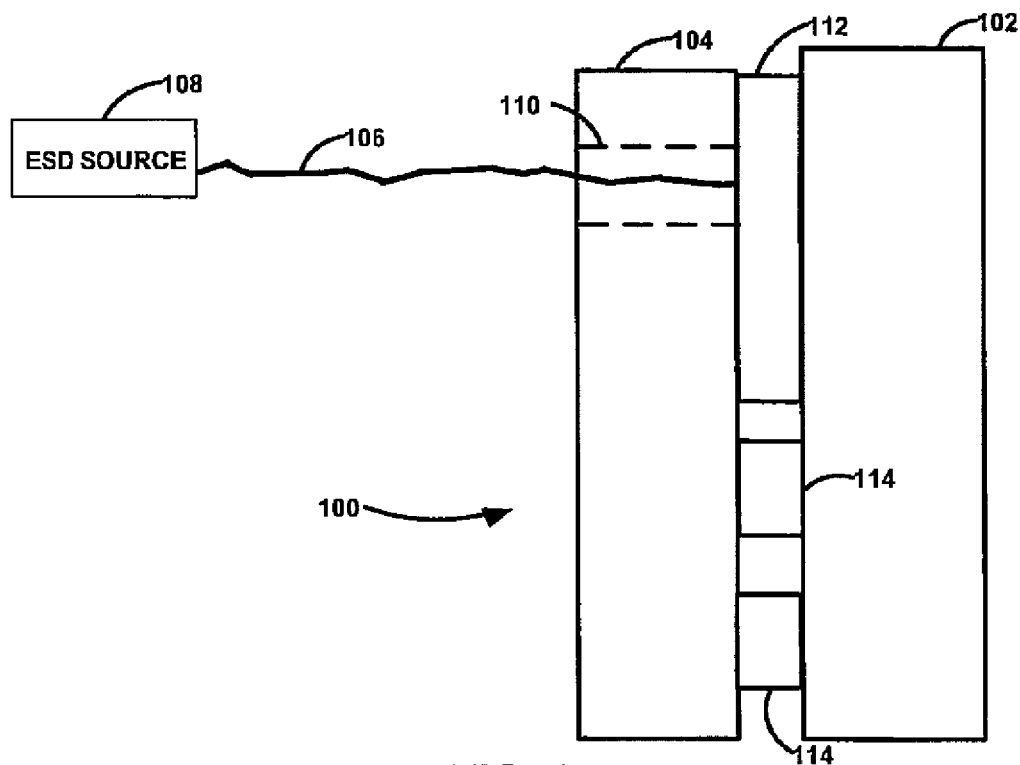
FIG. 1 is a block diagram of a side view of an electronic device in accordance with an exemplary embodiment of the invention.
Figure 2:
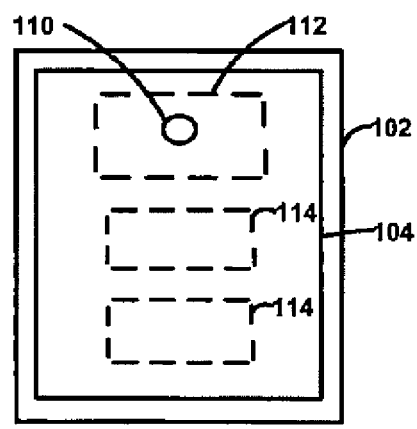
FIG. 2 is a block diagram of a top view of the electrical insulation sheet over the printed circuit board of the electronic device.

FIG. 1 is a block diagram of side view and FIG. 2 is a top view of an ESD protection assembly 100 of an electronic device in accordance with the exemplary embodiment of the invention. The blocks in FIG. 1 and FIG. 2 generally represent exemplary relative configurations of a printed circuit board 102 and an electrical insulation sheet 104 for protecting areas 114 within the electronic device from electrostatic discharge (ESD) 106 and do not necessarily represent all relative sizes or positions of the components illustrated. In the exemplary embodiments, the electrical insulation sheet 104 is implemented as part of a portable communication device such as, for example, a cellular telephone or wireless PDA.

As discussed above, electronic devices are susceptible to damage from ESD. An ESD source 108 such as a human figure or hand, metallic button on the device, or other object that may accumulate static charge, creates an electrostatic discharge (ESD) 106 when the impedance along any path from the ESD source 108 to the electronic device is sufficiently low. If the ESD path passes through or terminates at a critical component, damage can result. In the exemplary embodiment, the ESD 106 are guided through discharge paths that avoid electrical components and signal traces within discharge avoidance areas 114.

A discharge channel 110 within an electrical insulation sheet 104 provides a relatively low impedance path to the ground potential of the electronic device. The discharge channel 110 has a channel impedance that is less than the insulation sheet impedance of the electrical insulation sheet 104. The discharge channel 110 is positioned adjacent to an exposed ground area 112 of the printed circuit board 102. Accordingly, at least a portion of the ground area 112 is exposed under the discharge channel 110 to provide a closed electrical path to the device ground for the ESD 106. The ground area 112 is a section of copper on the surface of the PCB 102 in the exemplary embodiment. The ground area 112 may include vias to other ground layers within the PCB 102 and may have any of numerous shapes and sizes.

In the exemplary embodiment, the electrical insulation sheet 104 comprises a plurality of discharge channels 110 which are formed by openings in the electrical insulation sheet 104. The discharge channel 110, however, may be formed using other techniques or components. For example, the discharge channel 110 may include a layer of insulation material that is thinner than the insulation sheet 104 in some situations. Also, a conductive material may be inserted or otherwise positioned through the electrical insulation sheet 104 to provide the electrical path to the exposed ground area 112. The discharge channel 110, therefore, is any configuration, mechanism, or material that forms a path having a lower electrical impedance than the insulation sheet 104 in order to guide the ESD 106 to a target discharge area within the electronic device to avoid the discharge avoidance areas 114.

Figure 3:
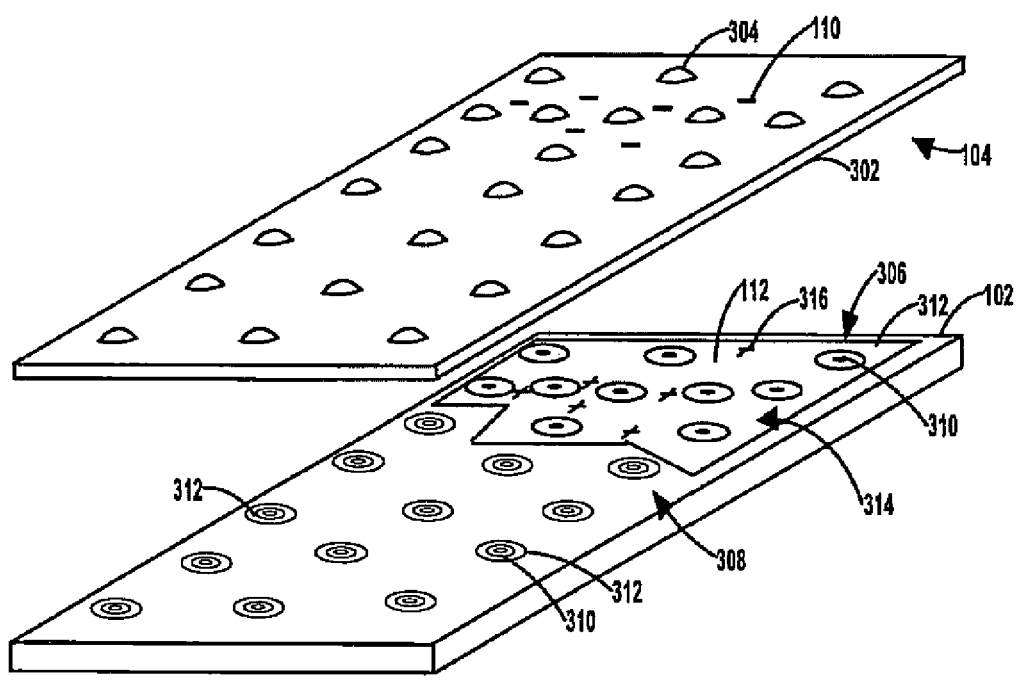
FIG. 3 is an illustration of a perspective exploded view of the ESD protection assembly in accordance with the exemplary embodiment where the electrical insulation sheet comprises a dome contact sheet.

FIG. 3 is an illustration of a perspective exploded view of the ESD protection assembly 100 in accordance with the exemplary embodiment where the electrical insulation sheet 104 comprises a dome contact sheet 302. The dome contact sheet 302 includes a plurality of dome contacts 304 that align with a set of contact pads 306-308 on the circuit board 102 when the ESD protection assembly 100 is assembled. The dome contacts 304 and contact pads 306-308 on the printed circuit board 102 form dome contact switches for buttons accessible from the exterior of the electronic device. Each dome contact 304 is aligned with the set of contact pads 306, 308, that include a center connect pad 310 and a peripheral contact pad 312. As discussed in further detail with reference to FIG. 4, the peripheral contact pad 312 is part of the ground area 112 for contact pads 306 within a target discharge area 314.

In the exemplary embodiment, the discharge channel 110 comprises a plurality of openings extending through the dome contact sheet 302. The openings are strategically aligned with target discharge locations 316 on the PCB 102 within the target discharge area 314. Damage to the electronic device due to ESD 106 is minimized by selecting target discharge locations 316 on the exposed ground area 112 of the PCB 102 at a safe distance from components and traces susceptible to ESD 106. Accordingly, an electrostatic discharge 106 to a target discharge location 316 results in a discharge that avoids the discharge avoidance area 114.

Figure 4:
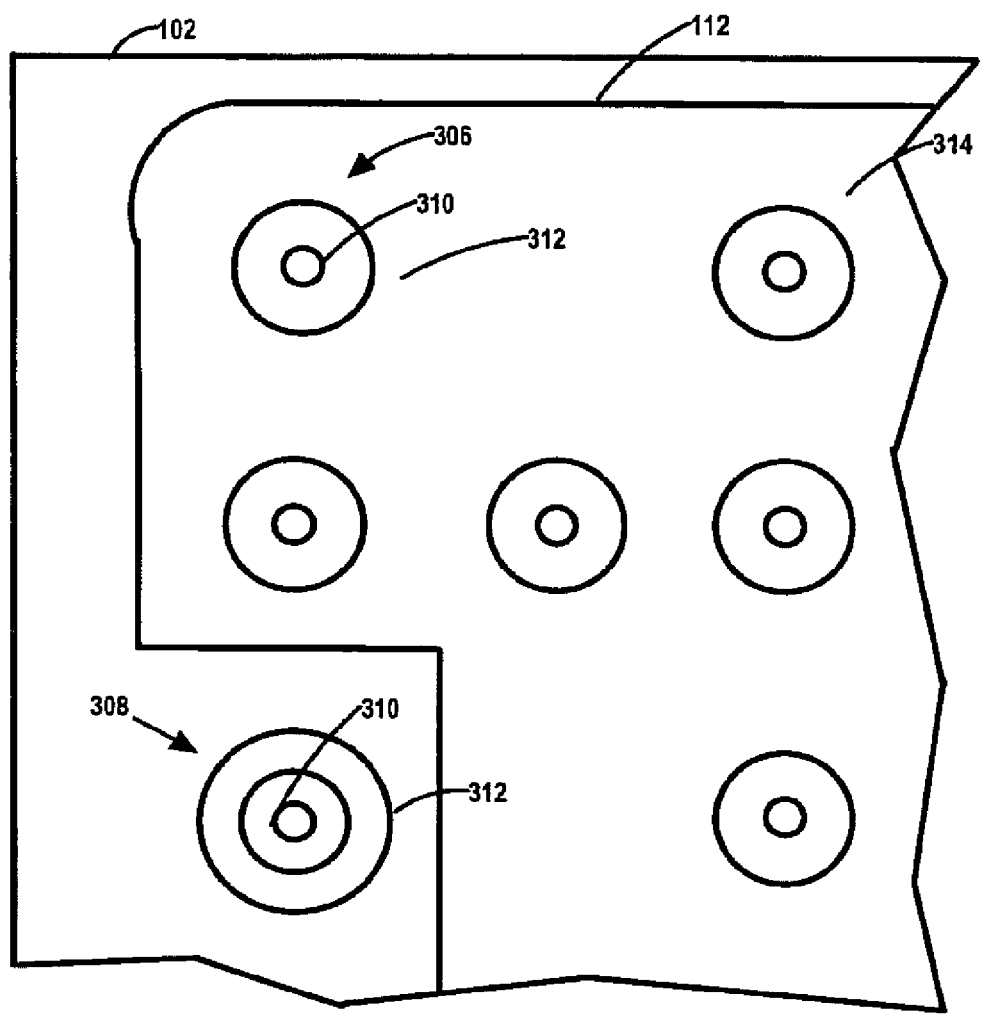
FIG. 4 is an illustration of a top view of a portion of the PCB in accordance with the exemplary embodiment.

FIG. 4 is an illustration of a top view of the PCB 102 in accordance with the exemplary embodiment. In accordance with known techniques, electrical connections are formed between a pair of contact pads 306, 308 when a dome contact 304 is depressed. As the dome contact 304 is depressed, it deforms to contact a center contact pad 310 while a portion of the electrically conductive dome contact 304 is in contact with a peripheral contact pad 312. An electrical connection between the center contact pad 310 and the peripheral contact pad 312 results. One or more of the contact pads 310, 312 are connected to a signal line. In many situations, a matrix formed with multiple signal lines including drive lines and sense lines allows a processor to determine activated switches based on unique combination connections between signals. Such a configuration minimizes the number of General Purpose Input Output (GPIO) lines that are dedicated to the keypad. The contact pads 306 within the target discharge area 314, however, include a peripheral contact 312 that is part of the ground area 112. In order to minimize the possibility of an ESD 106 through the dome contact 304 to a signal line, the peripheral contacts 312 are grounded while the center contact 310 is protected by the dome contact 304, which is in contact with the peripheral contacts 312, from ESD 106. Since one of the contact pads 312 is connected to ground, dedicated GPIO lines are required to sense the activation of the buttons corresponding to the dome contact switches. Since many GPIO lines remain unused in electronic devices, such a requirement is typically not an issue in most designs.

Figure 5:
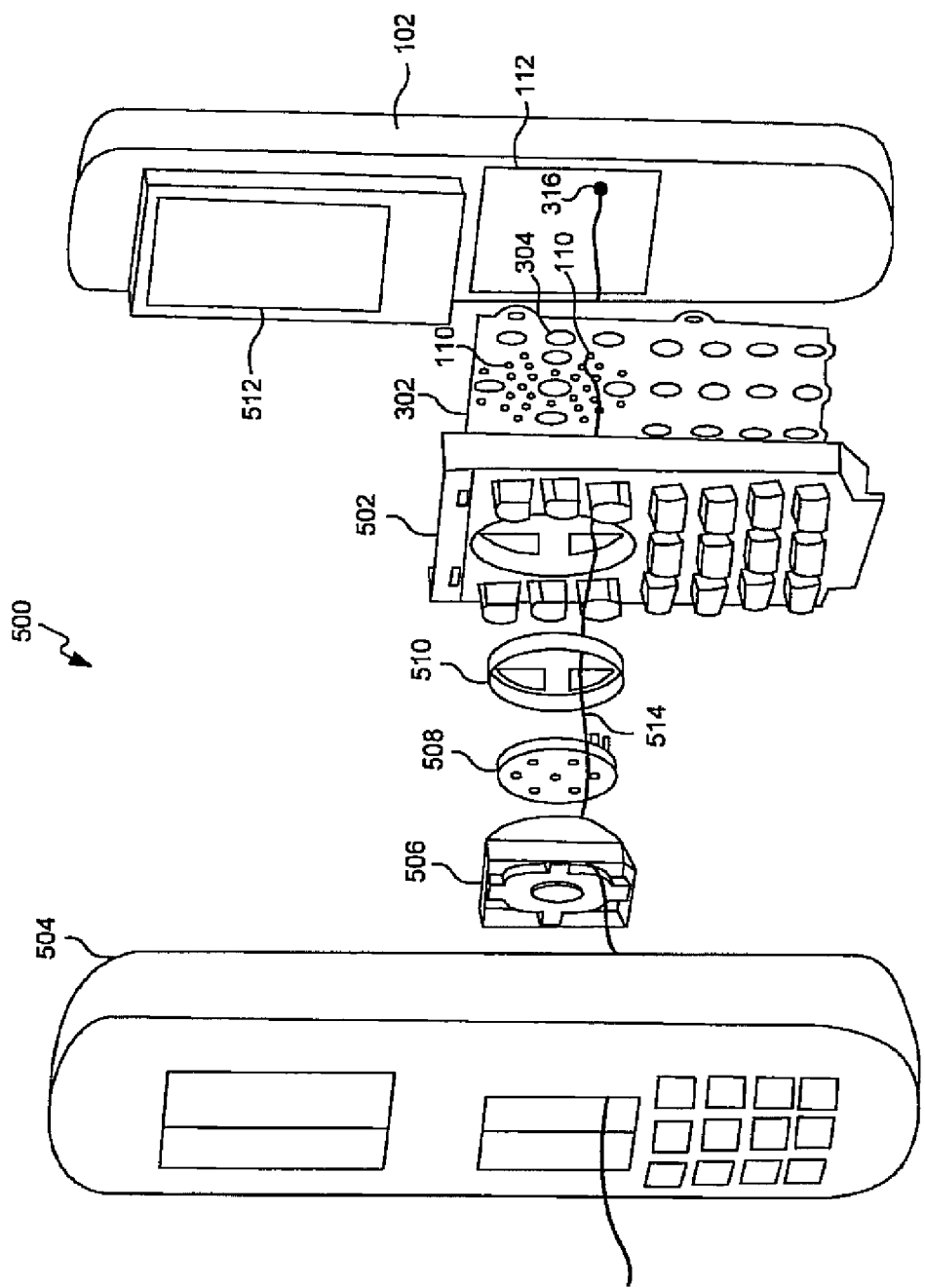
FIG. 5 is an illustration of an exploded view of an electronic device in accordance with the exemplary embodiment of the invention where the electronic device is a cellular telephone.

FIG. 5 is an illustration of an exploded view of an electronic device 500 in accordance with the exemplary embodiment of the invention where the electronic device is a portable communication device such as a cellular telephone. Any of numerous configurations and components can be used to form any of several types of devices that include the ESD protection methods and apparatuses in accordance with the descriptions herein. A flexible keypad 502 extends through a front portion of a housing 504 to provide a mechanism for activating the dome contact switches. A chrome key pad 506 accessible through an opening on the front portion of the housing 504 includes buttons for activating dome contact switches near a speaker 508. In the exemplary embodiment, the speaker 508 is positioned behind the chrome key pad 506 within a plastic speaker housing 510. The speaker housing 510 is positioned within a recessed area in the flexible keypad 502. Other components such as visual displays 512 also extend through openings within the housing 504.

In the exemplary embodiment, the chrome key pad 506 is a floating metallic object that accumulates chargers. The resulting increase in electrical potential will eventually find an electrical path to discharge. To avoid damage to components with the electronic device 500, at least one device discharge path 514 to the device ground is created by strategically positioning the discharge channels 112 in the dome contact sheet 302. A discharge path, therefore, includes one of the discharge channels 112 through the electrical insulation sheet 104 (dome contact sheet 302). The discharge path 514 provides a low impedance path to the ground area 112 that is lower than other paths from the exterior of the device 500. Accordingly, any ESD 106 is routed through the electronic device 500 without passing through the discharge avoidance area 114 thereby minimizing the likelihood of damage to the device components.

Therefore, in the exemplary embodiment, an electronic device 500 such as portable communication device includes a discharge path 514 for guiding ESD 106 to a ground area 112 of a printed circuit board 102. One or more discharge channels 110 within the electrical insulation sheet 104 have channel impedances less than the insulation electrical impedance of the electrical insulation sheet providing a relatively low impedance path for the ESD 106 to ground. The electrical insulation sheet 104 comprises a dome contact sheet 302 in the exemplary embodiment where a target discharge area 316 is formed over the exposed ground area 112. Accordingly, susceptibility to ESD 106 is minimized without additional components or insulation.

Clearly, other embodiments and modifications of this invention will occur readily to those of ordinary skill in the art in view of these teachings. The above description is illustrative and not restrictive. This invention is to be limited only by the following claims, which include all such embodiments and modifications when viewed in conjunction with the above specification and accompanying drawings. The scope of the invention should, therefore, be determined not with reference to the above description, but instead should be determined with reference to the appended claims along with their full scope of equivalents.

What is claimed is:

1. An electrostatic discharge (ESD) protection device comprising:

an electrical insulation sheet having an insulation electrical impedance in discharge avoidance region and having a discharge channel formed at least partially by ambient atmosphere and at least extending from a side of the electrical insulation through the electrical insulation to a ground area of a printed circuit board positioned opposite the side, having a channel electrical impedance less than the insulation electrical impedance and configured to direct an electrostatic discharge to the ground area.

2. An ESD protection device in accordance with claim 1, wherein the discharge channel is an opening within the electrical insulation sheet positioned adjacent to the ground area of the printed circuit board.

3. An ESD protection device in accordance with claim 2, wherein the electrical insulation sheet is a dome contact sheet comprising a plurality of dome contacts configured to make electrical connections on the printed circuit board when deformed.

4. An ESD protection device in accordance with claim 1, wherein the electrical insulation sheet has a plurality of discharge channels having channel impedances less than the insulation electrical impedance.

5. An electronic portable device comprising:
a printed circuit board comprising a ground area and a discharge avoidance area;
an electrical insulation sheet having discharge channel aligned over at least a portion of the ground area and having an channel electrical impedance less than an insulation electrical impedance of a region of the electrical insulation sheet aligned over the discharge avoidance area, the discharge channel formed at least partially by ambient atmosphere and at least extending from a first side of the electrical insulation sheet through the electrical insulation sheet.

6. An electronic portable device in accordance with claim 5, wherein the electrical insulation sheet has a plurality of discharge channels.

7. An electronic portable device in accordance with claim 5, wherein the electrical insulation sheet comprises a plurality of dome contacts positioned adjacent to a plurality of contact pads on the printed circuit board, each dome contact configured to form an electrical connection between a center contact pad and a peripheral contact pad when deformed.

8. An electronic portable device in accordance with claim 7, wherein peripheral contact pad comprises a ground potential contact area.

9. An electronic portable device in accordance with claim 8, further comprising:
a housing at least partially enclosing the printed circuit board and the electrical insulation sheet; and
device circuitry within the discharge avoidance area, the portable electronic device having at least one device discharge path extending from an exterior of the housing through the discharge channel to the ground area and having a path impedance less than any undesired discharge path passing through the device circuitry.

10. An electronic portable device in accordance with claim 9, wherein the device circuitry comprises one or more of signal traces on the printed circuit board and wires extending from the printed circuit board.

11. An electronic portable device in accordance with claim 9, wherein the device circuitry comprises electrical components on the printed circuit board.

12. An electronic portable device in accordance with claim 5, wherein the discharge channel is an opening within the electrical insulation sheet positioned adjacent to the ground area of the printed circuit board.

13. A portable communication device comprising:
a printed circuit board comprising a ground area and a plurality of contact pad sets comprising a center contact area and a peripheral contact area;
an electrical insulation sheet comprising a plurality of dome contacts positioned over the contact area pairs and configured to form an electrical connection between a corresponding center contact area and a corresponding peripheral contact area, the electrical insulation sheet having a plurality of discharge channels formed at least partially by ambient atmosphere and extending from a side opposite the printed circuit board, through the insulation sheet and having electrical impedances less than an insulation electrical impedance of the electrical insulation sheet in regions aligned over discharge avoidance areas on the printed circuit board, the discharge channels positioned adjacent to at least portions of the ground area.

14. A portable communication device in accordance with claim 13, wherein the discharge channels are configured to direct an electrostatic discharge originating on a side opposite the printed circuit board to the ground area.

15. A portable communication device in accordance with claim 13, wherein the peripheral contact pad comprises a ground potential contact area.

16. A portable communication device in accordance with claim 13, wherein each of the discharge channels is an opening within the electrical insulation sheet positioned adjacent to the ground area of the printed circuit board.

17. A portable communication device in accordance with claim 13, further comprising:
a housing at least partially enclosing the printed circuit board and the electrical insulation sheet; and
device circuitry within the discharge avoidance areas, the portable communication device having at least one device discharge path extending from an exterior of the housing through one of the discharge channels to the ground area and having a path impedance less than any undesired discharge path passing through the device circuitry.

18. A portable communication device in accordance with claim 17, wherein the device circuitry comprises one of signal traces on the printed circuit board and wires extending from the printed circuit board.

19. A portable communication device in accordance with claim 17, wherein the device circuitry comprises electrical components on the printed circuit board.

20. A portable communication device in accordance with claim 17, further comprising an electrically conductive button, device discharge path passing through electrically conductive button.

21. An ESD protection device in accordance with claim 1, wherein the ground area comprises:
a section of copper on a surface of the printed circuit board.

* * * * *